United States Patent [19]

Kopec et al.

[11] Patent Number: 5,053,911
[45] Date of Patent: Oct. 1, 1991

[54] SOLENOID CLOSURE DETECTION

[75] Inventors: James W. Kopec, St. Charles; Philip Herbert, Downers Grove, both of Ill.

[73] Assignee: Motorola, Inc., Schaumburg, Ill.

[21] Appl. No.: 361,629

[22] Filed: Jun. 2, 1989

[51] Int. Cl.$^5$ ............................................. H01H 47/32
[52] U.S. Cl. .................................... 361/154; 361/187; 123/490
[58] Field of Search ............... 361/139, 152, 153, 154, 361/160, 187; 123/490

[56] References Cited

U.S. PATENT DOCUMENTS

| 34012,026 | 12/1979 | Schulzke et al. | 361/154 |
|---|---|---|---|
| 4,225,898 | 9/1980 | Weber et al. | 361/154 |
| 4,234,903 | 11/1980 | Harper | 361/154 |
| 4,238,813 | 12/1980 | Carp et al. | 361/154 |
| 4,266,261 | 5/1981 | Streit et al. | 361/154 |
| 4,327,394 | 4/1982 | Harper | 361/154 |
| 4,338,651 | 7/1982 | Henrich | 361/154 |
| 4,417,201 | 11/1983 | Reddy | 361/154 |
| 4,479,161 | 10/1984 | Henrich et al. | 361/154 |
| 4,511,945 | 4/1985 | Nielsen | 361/154 |
| 4,680,667 | 7/1987 | Petrie | 361/154 |
| 4,729,056 | 3/1988 | Edwards et al. | 361/154 |
| 4,763,222 | 8/1988 | Heaston et al. | 361/152 |
| 4,845,420 | 7/1989 | Oshizawa et al. | 361/152 |

OTHER PUBLICATIONS

Radio Shack New 1974-1975 Unabridged Dictionary of Electronics, 4th Edition, Rudolf F. Graf, Ft. Worth, TX 76107.
"DDEC Detroit Diesel Electronic Control" by Hames et al.; Published in SAE Technical Papers, 1985, Intl. Congress & Expo., Detroit, MI, 2/25-3/1/85, #861110.
"DDEC II Advanced Electronic Diesel Control" by Hames et al.; Published in SAE Technical Papers, 1986, West Coast Intl. Meeting, University City, CA, 8/4-8/6/86, #850542.

Primary Examiner—A. D. Pellinen
Assistant Examiner—Jeffrey A. Gaffin
Attorney, Agent, or Firm—John H. Moore

[57] ABSTRACT

A method and apparatus for electronically detecting when a solenoid has closed, or nearly closed, indirectly senses changes in the inductance of the solenoid's coil as the solenoid closes. When the inductance has changed by a selected amount, the solenoid is assumed to have closed, or nearly closed, and current through the coil is promptly reduced. Preferably, changes in the inductance of the coil are sensed by establishing a plurality of current peaks in the coil, and sensing the current's decay time between peaks. When the decay time of a measured current peak exceeds the decay time of a previously measured current peak by a selected amount, it is assumed that the solenoid has closed, or nearly closed.

13 Claims, 6 Drawing Sheets

SOLENOID CLOSURE DETECTION

TECHNICAL FIELD

This invention is directed generally to the field of electronic circuits that control the opening and closing of a solenoid by controlling the level of current through the solenoid. Such circuits are referred to herein as solenoid drivers.

BACKGROUND OF THE INVENTION

Solenoids are frequently used to inject fuel into automotive engines, to control electronic transmissions, and sometimes to actuate brakes on a vehicle. All such solenoids use a solenoid driver that causes current to be injected into the solenoid's coil at preselected times and at preselected levels in order to control the position of the solenoid's armature.

One of the drawbacks of conventional solenoid drivers is that they consume an undesirably high level of power when they are causing a solenoid to close (i.e., when the solenoid's armature is being seated). This high power consumption is particularly evident in solenoid drivers that are designed to rapidly close a solenoid, such as the solenoid in a fuel injector.

Not only is the high level of power consumption wasteful, but it also requires relatively expensive output transistors that are capable of safely dissipating such power. Some applications also require that the output transistors be mounted on a heat sink, thus further increasing the cost of the solenoid driver.

OBJECTS OF THE INVENTION

It is a general object of the invention to provide an improved solenoid driver and an improved method of controlling the current in a solenoid.

It is a more specific object of the invention to provide a method and apparatus for controlling the current in a solenoid so as to reduce the power consumed during solenoid closure while also achieving rapid closure of the solenoid.

DESCRIPTION OF THE PREFERRED EMBODIMENT

According to one aspect of the present invention, a current is established in the coil of a solenoid in order to initiate closure of the solenoid and, while the solenoid is closing, relative changes in the inductance of the solenoid's coil are indirectly sensed. When the sensed change in the coil's inductance reaches a selected amount the current through the coil is reduced.

This technique is based on the fact that the inductance of the solenoid coil changes (normally increases) as the solenoid's armature approaches its closed position. The present invention reduces power dissipation by reducing the level of current in the coil when the coil's inductance increases to a point which is indicative of the solenoid having reached a closed, or nearly closed, position. In this manner, the current in the coil is reduced as quickly as possible to conserve power, without slowing down the closure of the solenoid.

In the present invention, the changing inductance of the solenoid's coil is sensed only indirectly, meaning that a direct measurement of inductance does not occur. Instead, we sense a signal (e.g. current or voltage) that is indicative of the change in the coil's inductance.

Specifically, the preferred embodiment of our invention causes a current to be established in the coil, and the decay time of that current is measured (alternately, the rise time of the same current could be measured, but it is preferable to measure the decay time because it is usually independent of supply voltage and, therefore, more predictable). Because the decay time of the current is a function of the inductance of the coil, a sensed increase in the decay time indicates an increase in coil inductance. It also indicates that the solenoid is closing. Hence, by sensing when the decay time has increased by a selected amount, one can reliably infer that the solenoid has reached, or nearly reached, its closed position. The current through the coil is then reduced to avoid unnecessary power dissipation.

In the particular embodiment of the invention shown herein, a plurality of current peaks are established in the solenoid's coil. Each of these peaks tends to move the solenoid's armature toward its closed position, and each such peak also has its own decay time. We make use of that fact by sensing the decay times of at least some of the current peaks, and when the decay time of a measured current peak exceeds the decay time of one or more previously measured current peaks by a selected amount, we infer that the relative inductance of the coil has changed sufficiently to indicate that the solenoid's armature has reached, or nearly reached, its closed position. The current through the solenoid's coil is then reduced.

Figure 1:
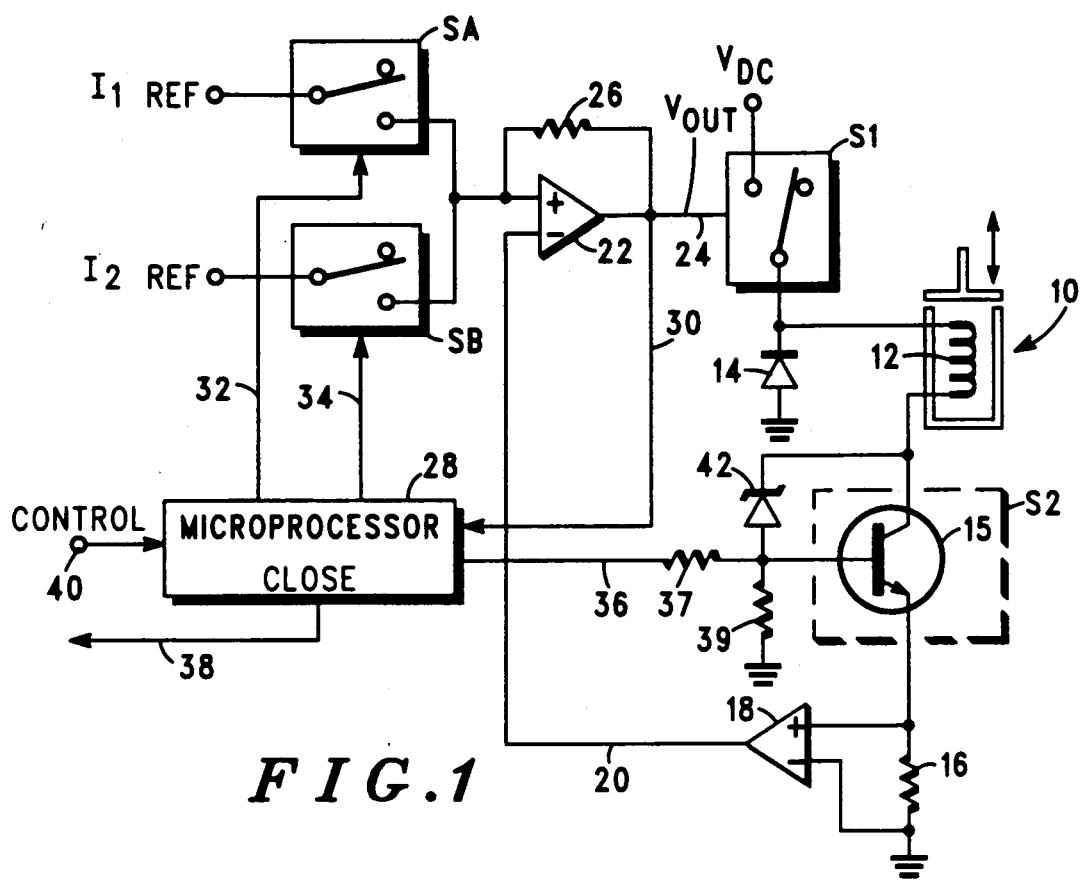
FIG. 1 a schematic diagram of a solenoid driver circuit in accordance with the invention.

Referring now to FIG. 1, a typical solenoid 10 is shown. This solenoid is actuated by the other structure shown in FIG. 1, including a solenoid driver that is constructed according to this invention.

The solenoid 10 includes a coil 12, one end of which is coupled to a recirculating diode 14 and a switch S1. The switch S1 is opened and closed to connect the coil to, and disconnect the coil from, a source of dc voltage $V_{DC}$.

The other end of the coil 12 is connected to a switch S2 that may be formed by a bipolar transistor 15. The emitter of this transistor 15 is coupled to ground via a resistor 16. Thus, with the transistor 15 turned on, and the switch S1 closed, a completed current path is established through the coil 12 for closing the solenoid 10.

The current through the coil 12 is sensed by an amplifier 18 which is coupled across the resistor 16. The amplifier's output is coupled via a lead 20 to one input of a comparator 22. The comparator's other input receives a reference current level which is either $I_1$ or $I_2$, depending on the state of switches SA and SB. As discussed in more detail later, the comparator 22 effectively compares the level of current through the coil 12 to the reference current levels $I_1$ and $I_2$, and depending on the results of the comparison, opens or closes the switch S1 by means of a switching pulse developed on the comparator's output lead 24. A resistor 26 is coupled around the comparator 22 to cause the comparator to operate with hysteresis, as will also be described more fully below.

Control of the injector driver is exercised by the logic programmed in a microprocessor 28 which may be, for example, a 68HC11 microprocessor made by Motorola, Inc. The microprocessor senses the output of the comparator 22 via a lead 30, actuates switches SA and SB via signals on leads 32 and 34, and supplies base drive for the transistor 15 via a lead 36 and a divider consisting of resistors 37 and 39. It also outputs a "close" signal via a lead 38 to indicate to other apparatus that the solenoid 10 has closed.

The operation of the injector driver is as follows. When it is desired to close the solenoid 10, a signal labelled "control" (see FIG. 2) is applied to the microprocessor at an input terminal 40. In response, the microprocessor outputs a signal on lead 32 that closes the switch SA, thereby applying the I1 reference level to one input of the comparator 22. As there is no current now flowing through the coil 12, the comparator senses that the $I_1$ reference level exceeds the level of current through the coil and outputs a high level signal $V_{OUT}$ (See FIG. 2) on lead 24 to close the switch S1. The microprocessor also supplies base drive to the transistor 15 to turn it on hard. Consequently, current now begins to flow through the coil 12 and the resistor 16. This current is shown as $I_{SOL}$ in FIG. 2.

When the current through the coil ($I_{SOL}$) reaches the level of $I_1$ at time $t_1$ (FIG. 2), the output of the comparator ($V_{OUT}$) goes low to open the switch S1 (transistor 15 remains on), thus causing the current through coil 12 to decay slowly while recirculating through the diode 14. Simultaneously, the low level signal on lead 24 is coupled via the resistor 26 to the comparator 22 input to lower the reference level there to a level somewhat below $I_1$, indicated as $I_{1a}$ in FIG. 2. Consequently, the current in the coil 12 is allowed to decay until it reaches the level of $I_{1a}$. When that occurs, the output from the comparator 22 once again goes high to close the switch S1 and cause the coil current to again increase toward the level if $I_1$. Upon again reaching the level of $I_1$, the coil current is interrupted again by the comparator 22 and allowed to decay to the level $I_{1a}$.

Figure 2:
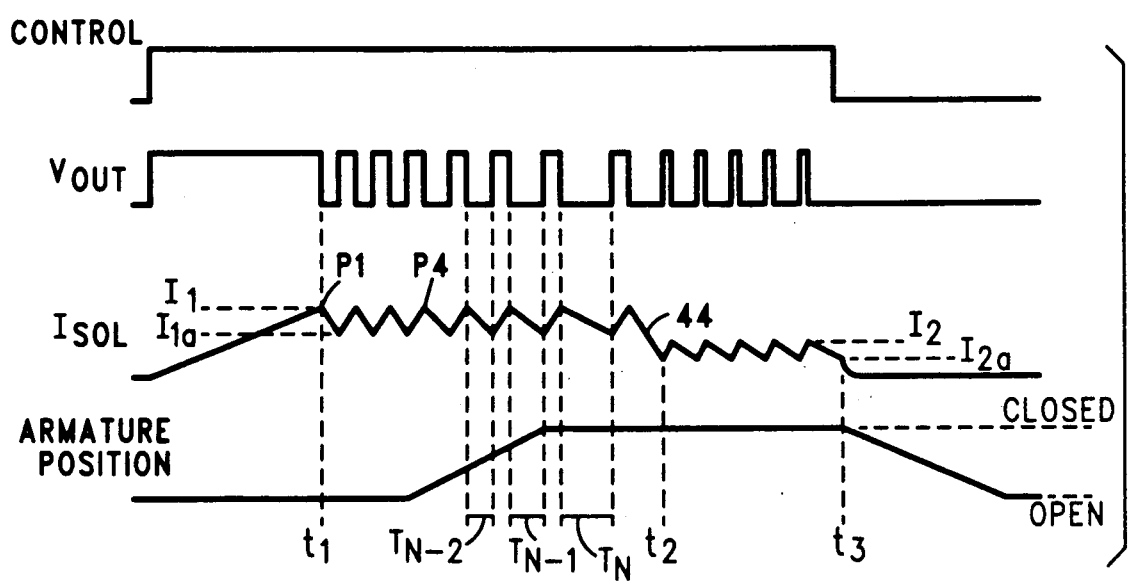
FIG. 2 shows waveforms that are useful in explaining the operation of the circuit shown in FIG. 1.

The foregoing process may continue for several cycles, each time causing a current peak to be established in the coil 12, followed by a decay in the current level. For example, the solenoid current ($I_{SOL}$) is shown in FIG. 2 as including four such peaks, P1 through P4 that occur after time $t_1$. Immediately following each such peak, the current decays to the level $I_{1a}$.

It is significant to note that while the current peaks P1-P4 are being generated, the solenoid itself starts to move, and the closer it moves toward its final, seated position, the smaller its air gap becomes. As the size of the air gap decreases, the solenoid's inductance increases. The present invention uses this information to reduce the solenoid current relatively early in comparison to conventional solenoid drivers. This early reduction in current decreases the overall power consumption of the solenoid because it requires more power to keep trying to move the solenoid toward its closed position than to hold it at the same position. Further, this early reduction in the level of the solenoid current loes not delay the seating of the solenoid.

As mentioned above, the inductance of the solenoid increases as the solenoid comes closer to being seated. Because an increase in the solenoid's inductance generally results in an increase in the decay time (and in the rise time) of its current, one can sense and evaluate that decay time to infer when the solenoid has closed, and then promptly reduce the current through the coil. The same effect can be accomplished by measuring the rise time of the current in the coil, but, as mentioned before, the decay time is usually more predictable.

Referring again to FIG. 2, it can be seen that the decay time of the solenoid current increases with time. That is, the time required for the current to decay from the level $I_1$ to the level $I_{1a}$ is greater after the peak P4 than it was immediately after the peak P1. Moreover, the decay time increases after every current peak because the solenoid is increasingly closer to being seated and its inductance is undergoing a corresponding increase. The preferred embodiment of this invention measures those increases in decay time and reduces the current through the coil when a selected increase has been detected.

In the embodiment illustrated in FIG. 1, the change in the inductance of the coil 12 is measured by sensing the output of the comparator 22 ($V_{OUT}$) because the time between low level outputs in $V_{OUT}$ is equal to the decay time of $I_{SOL}$, which, in turn, is directly related to the changed value of the inductance. Specifically, the microprocessor 28 senses $V_{OUT}$ via the lead 30 and measures the time interval between adjacent pulses in $V_{OUT}$. Referring again to FIG. 2, the microprocessor may first sense and measure the time interval shown as $T_{N-2}$. Thereafter, it senses and measures the subsequent time intervals $T_{N-1}$ and $T_N$. While these measurements are being made, the microprocessor also compares a measured time interval against one or more previously measured time intervals. If the last measured interval has increased by a selected amount compared to previously measured intervals, the microprocessor assumes that the solenoid has closed, or nearly closed, as shown in FIG. 2 by the diagram entitled "armature position". When such closure is sensed, the microprocessor outputs its "close" signal on lead 38, it opens the switch SA and closes the switch SB, and it removes the base drive from the transistor 15 to open the switch S2. The comparator 22 now opens the switch S1. Consequently, the voltage across S2 rises until it breaks down a zener diode 42 that is coupled from the collector of transistor 15 to its base. This forces the transistor 15 to turn on in a linear mode to quickly dissipate energy in the coil 12, thereby permitting the current in the coil 12 to decay rapidly, as indicated by the rapid decay line 44 in FIG. 2.

When the solenoid current decays to the level $I_{2a}$, (the level of $I_2$ less the effect of the hysteresis provided by resistor 26) at time $t_2$, the comparator 22 again generates a high level output, thereby closing the switch S1. The microprocessor also resumes base drive to the transistor 15 to close S2. Once again, the solenoid current increases, and when it reaches the level $I_2$, the comparator 22 outputs a low level signal to open S1. This cycle may repeat so long as it is desired to maintain the solenoid in a "hold-in" condition. At some later time $t_3$, when it is desired to open the solenoid, the switches S1 and S2 may be opened as described previously to allow the solenoid current to decay below the "hold-in" level.

The sequence of operations described above may be carried out under the control of various types of controllers. Herein, the preferred controller is the programmed microprocessor 28. The logic programmed into the microprocessor to carry out such control will now be described in terms of the flow charts shown in FIGS. 3, 4 and 5.

Figure 3:
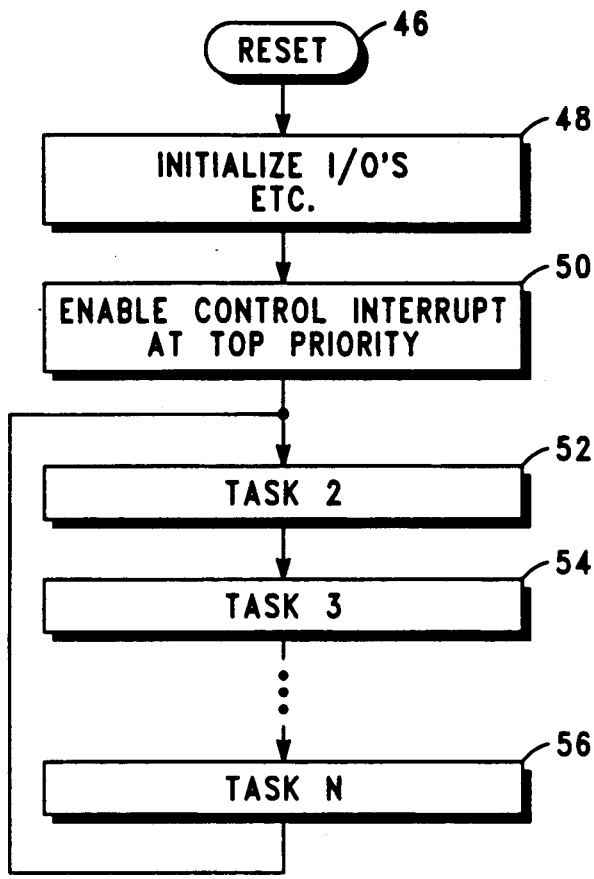
FIGS. 3, 4 5A and 5B are flow charts illustrating how the microprocessor shown in FIG. 1 may be programmed to accomplish the purposes of the invention.

FIG. 3 shows, in a very general way, the microprocessor's prioritized routine for accomplishing its various tasks. After a reset instruction 46 and an initialization step 48, the microprocessor executes instruction 50 which causes the microprocessor to look for a control interrupt and, when that interrupt is received, to immediately begin execution of the routine shown in FIG. 4 (which pertains to control of the solenoid current). The instruction 50 is followed, as shown, by various other instructions 52, 54, 56 that enable the microprocessor to accomplish other tasks that are unrelated to this invention. Suffice it to say that instruction 50 causes the microprocessor to exercise control over the solenoid current as its task of top priority.

Figure 4:
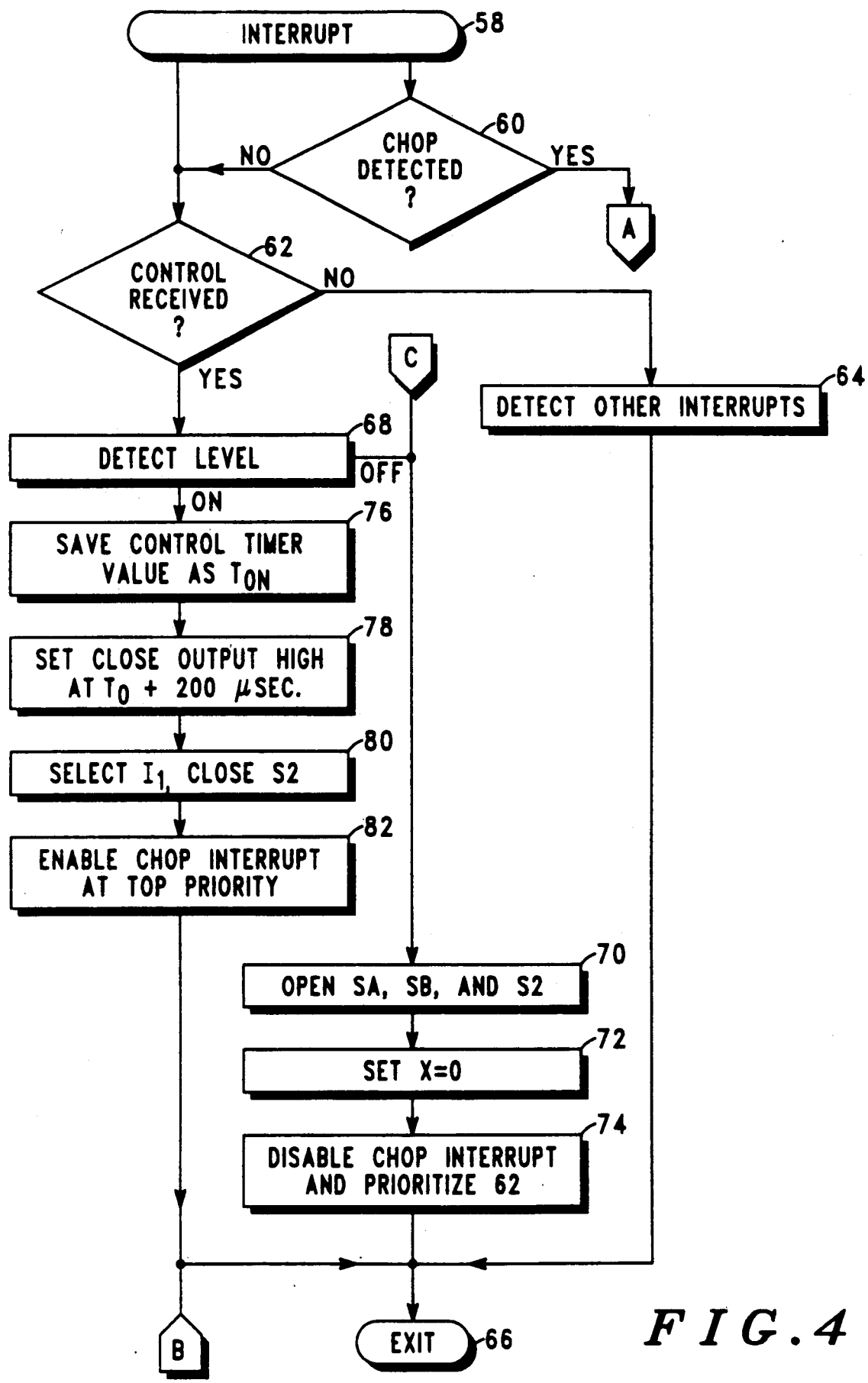

Upon receipt of an appropriate control interrupt, the program shown in FIG. 4 is executed. Following the interrupt (58), either instruction 60 or instruction 62 will be executed, depending on their priority status. On the first pass through this program, instruction 62 will be executed. This instruction determines whether the "control" signal (FIG. 6) has been applied to terminal 40 (FIG. 1) of the microprocessor. If the control signal has not been received, instruction 64 causes the microprocessor to look for other interrupts and then to exit (66) this program so it can return to the general routine shown in FIG. 3.

If the control signal has been received when instruction 62 is executed, the next instruction 68 asks whether the level of the control signal is "on" (high) or "off" (low). If the control signal is off when instruction 68 is executed, this means that the solenoid 10 should be opened by removing its current. The program continues to instruction 70 which causes switch SA or SB, whichever is closed, to be opened and the switch S2 to be opened by removing base drive current from the transistor 15. Then, instruction 72 sets "x" to zero ("x" is a counter value that is discussed more fully later), instruction 74 disables the chop interrupt (the term "chop" refers to the transitions which occur at the output ($V_{out}$) of the comparator 22 as the solenoid current moves between current levels I and $I_{1a}$, or $I_2$ and $I_{2a}$), prioritizes instruction 62 to be the first instruction to be executed upon sensing the next interrupt, and proceeds to exit 66 which allows the microprocessor to return to the program shown in FIG. 3.

Figure 6:
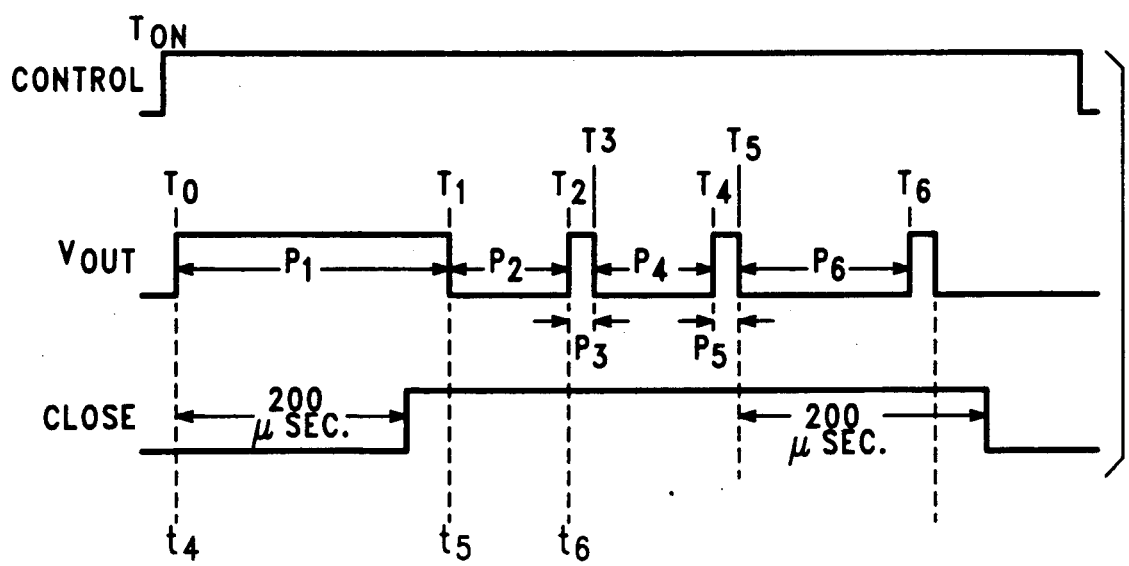
FIG. 6 shows waveforms that are useful in explaining how the circuit shown in FIG. 1 operates under the control of the flow charts shown in FIGS. 4 5A and 5B.

Assume now that another interrupt has been detected and that instruction 62 determines that the control signal has been received, and that instruction 68 detects the control signal as being "on" (high). In that case, the next instruction 76 causes the microprocessor to sense the value of an internal timer and to call that sensed value "$T_{ON}$". As shown in FIG. 6, TON is designated as the time when the control signal goes high. The next instruction 78 causes the microprocessor's "close" output (see FIG. 6) to go high a fixed time (e.g., 200 microseconds) after $T_{ON}$ to account for processing delays within the microprocessor.

The program continues by executing instruction 80 which causes the reference current $I_1$ (see FIG. 1) to be selected (i.e., the switch SA becomes closed). The same instruction also causes the microprocessor to supply base drive to the transistor 15 to close the switch S2. The comparator 22 will then drive $V_{OUT}$ high at time $t_4$, and current will begin flowing through the coil 12.

Referring next to instruction 82, this instruction enables the microprocessor to begin looking for "chop", i.e., transitions in $V_{OUT}$, as its highest priority. Consequently, the next time an interrupt occurs (58), instruction 60 will be executed. In the interval before any such interrupt occurs, the program exits at 66 to resume the program shown in FIG. 3.

When the next interrupt occurs, instruction 60 causes the microprocessor to determine whether "chop" has been detected. Refer to FIG. 6 which shows another illustration of $V_{OUT}$, and its accompanying transitions, that will be used to help explain chop detection and other aspects of the program. It can be seen from FIG. 6 that, at time $T_{ON}$ the control signal (applied to terminal 40 of the microprocessor) goes high to initiate closure of the solenoid 10, and $V_{OUT}$ goes high at time $t_4$. About 200 microseconds after $t_4$, the close signal generated on lead 38 of the microprocessor goes high to indicate to other apparatus that the solenoid is being closed. During this time, solenoid current is increasing toward the reference level $I_1$, (FIG. 1), and when that level is reached at time $t_5$ (FIG. 6), a negative-going transition occurs in $V_{OUT}$. This transition, or edge, is what instruction 60 looks for. If it finds such an edge, the program exits FIG. 4 and resumes at "A" in FIG. 5.

Per instruction 84 in FIG. 5, the status of a closure flag is evaluated. Closure of this flag indicates that closure of the solenoid's armature has been detected. If the closure flag is not set (it ordinarily will not have been set on the first pass through this part of the program), the program continues to instruction 86. At this point, the value of X is sensed. This value, which is stored in an internal counter, is equal to the number of edges or transitions in $V_{OUT}$.

The value of X will be zero on the first pass through this part of the program, so instruction 88 is executed next.

According to instruction 88, the microprocessor ascertains the value of an internal timer that had a count of T when the chop interrupt first occurred. Thus, T corresponds to time $t_4$ (FIG. 6), the time at which the first transition occurred in $V_{OUT}$.

Next, instruction 92 subtracts $T_{ON}$ from T and defines the result as $T_X$. Thus, $T_X$ (now $T_0$) corresponds to the very small time lapse between the control signal going high and the initial high level transition in $V_{OUT}$. On this first pass through the program, $T_X$ is very small because the first transition in $V_{OUT}$ occurs very shortly after $T_{ON}$. Subsequent $T_X$'s (i.e., $T_1$, $T_2$, $T_3$, etc.) will have larger values.

Next, instruction 94 (FIG. 5B) increments X, thereby setting X equal to 1 at this time. The program then proceeds to the exit point 66 (FIG. 4) via "B".

"Chop" will next be detected by instruction 60 (FIG. 4) at time $t_5$ (FIG. 6) as a result of $V_{OUT}$ going low. The program will proceed to instruction 86 (FIG. 5a) via "A" and instruction 84, at which time X will not be equal to zero. Consequently, the program proceeds to instruction 96 to determine whether X is greater than a selected constant "K". The constant K is an upper limit on X for the purpose of avoiding an infinite loop in the program. If X is greater than K, a fault condition is acknowledged via instruction 98, and the program proceeds via "C" to instruction 70 in FIG. 4.

Referring back to instruction 96, the program will normally proceed to instruction 100 to determine if the value of X is odd. An odd value for X indicates a negative-going transition in $V_{OUT}$, whereas an even value indicates a positive-going transition. If X is even, instruction 102 is executed next to determine whether "Chop equals 1". Chop is considered to be equal to 1 when $V_{OUT}$ is high, and Chop is considered to be equal to zero when $V_{OUT}$ is low. Thus, if the execution of instruction 102 reveals $V_{OUT}$ to be low when X is even, a fault condition will have occurred and the program will proceed to instruction 98. Likewise, if X is odd and $V_{OUT}$ is high (per instruction 104), a fault condition will have occurred.

Assuming that no faults have occurred, the program continues to instruction 106 which determines the time interval from $T_0$ (when $V_{OUT}$ first goes high, corresponding to $t_4$ in FIG. 6) to the time of the last chop interrupt (corresponds to the last detected transition in $V_{OUT}$). Because X now equals 1, instruction 106 calculates a value for $T_1$ ($T_1$ corresponds to $t_5$ in FIG. 6). A value for $T_0$ was previously calculated per instruction 92. Instruction 108 now calculates $P_1$ (see FIG. 6) as the difference in time between $T_1$ and $T_0$.

Next, instruction 110 asks whether X is less than 4 in order to ensure that $V_{out}$ has been low for at least two periods (such as $P_2$ and $P_5$) before making additional calculations in a later instruction 116. If X is less than 4, the program proceeds to instruction 94 which increments X, and then the program proceeds via B to the exit 66 in FIG. 4.

If X is equal to or greater than 4, instruction 112 is executed to determine whether the present value of X is odd or even. An even value of X indicates that the last sensed transition was a rising edge, and that a low period (such as $P_2$) in $V_{out}$ has been completed. If X is even, instruction 114 is executed to calculate the duration of the last low period in $V_{out}$.

Before continuing with an explanation of instruction 114, refer again to instructions 106 and 108. By instruction 106, the time associated with each edge was calculated. Thus, the times $T_0$, $T_1$, $T_2$, $T_3$, $T_4$, $T_5$ and $T_6$ (see $V_{out}$ in FIG. 6) were all calculated during successive passes through this part of the program. Instruction 108 calculated the duration of the periods between successive times $T_0$, $T_1$, $T_2$, etc. For example, the duration of the time period $P_1$ (FIG. 6) is equal to the difference in time between the times $T_1$ and $T_0$. Similarly, the duration of the time period $P_6$ is equal to the difference in time between the times $T_6$ and $T_5$. When instruction 114 is executed, X will be even and greater than 4. Thus, if X equals 6 on this pass through the program, instruction 114 calculates a difference D between periods $P_6$ and $P_4$, i.e., the difference in duration between the last two low periods of $V_{out}$.

Instruction 116 (FIG. 5B) essentially determines whether the solenoid's armature has closed, or nearly closed, by determining whether D (as calculated in instruction 114) is greater than a percentage R of the previous low period. If X equals 6, instruction 116 asks whether the difference between $P_6$ and $P_4$ (D) is greater than R percent of $P_4$. The value of the constant R depends on the type of solenoid, the solenoid's load, etc., but is typically 5 to 15. If D is greater than R percent of $P_4$, this indicates that the period $P_6$ is sufficiently longer than the period $P_4$ that we can assume that the solenoid has seated, or nearly seated, in which case the program proceeds to instruction 118. Otherwise, the program proceeds to increment X for the next pass through this part of the program.

The purpose of the next few instructions is to signal the occurrence of solenoid closure as close to the actual time of closure as possible. By instruction 118, it is determined whether the value of D is greater than R plus 5% of $P_4$ (assuming X still equals 6). The value of S, typically from 5 to 10, depends on solenoid and system characteristics. Stated differently, instruction 118 asks whether the value of D is greater by a given amount than the value that was ascertained by instruction 116. If the answer is yes, the program assumes that solenoid closure occurred near to time $T_4$, and instruction 120 announces the time of closure ($T_{close}$) as $T_4$. If the execution of instruction 118 resulted in an answer of no, the program assumes that the actual time of closure of the solenoid is nearer to $T_5$, and instruction 122 makes that announcement.

Instruction 124 sets a "closure flag" to indicate that the solenoid's armature has closed, and instruction 126 schedules the "closure output" of the microprocessor (the close signal shown in FIG. 6) to go low at $T_0$ plus $T_{close}$ plus 200 microseconds. The 200 microseconds is added to account for processing time delays in the microprocessor. Referring again to FIG. 6 and particularly to the illustrated close signal, it is assumed that the actual closure time was determined (by instruction 122) to be at or near $T_5$, wherefore the close signal is shown as going low 200 microseconds after $T_5$.

Figure 5A:
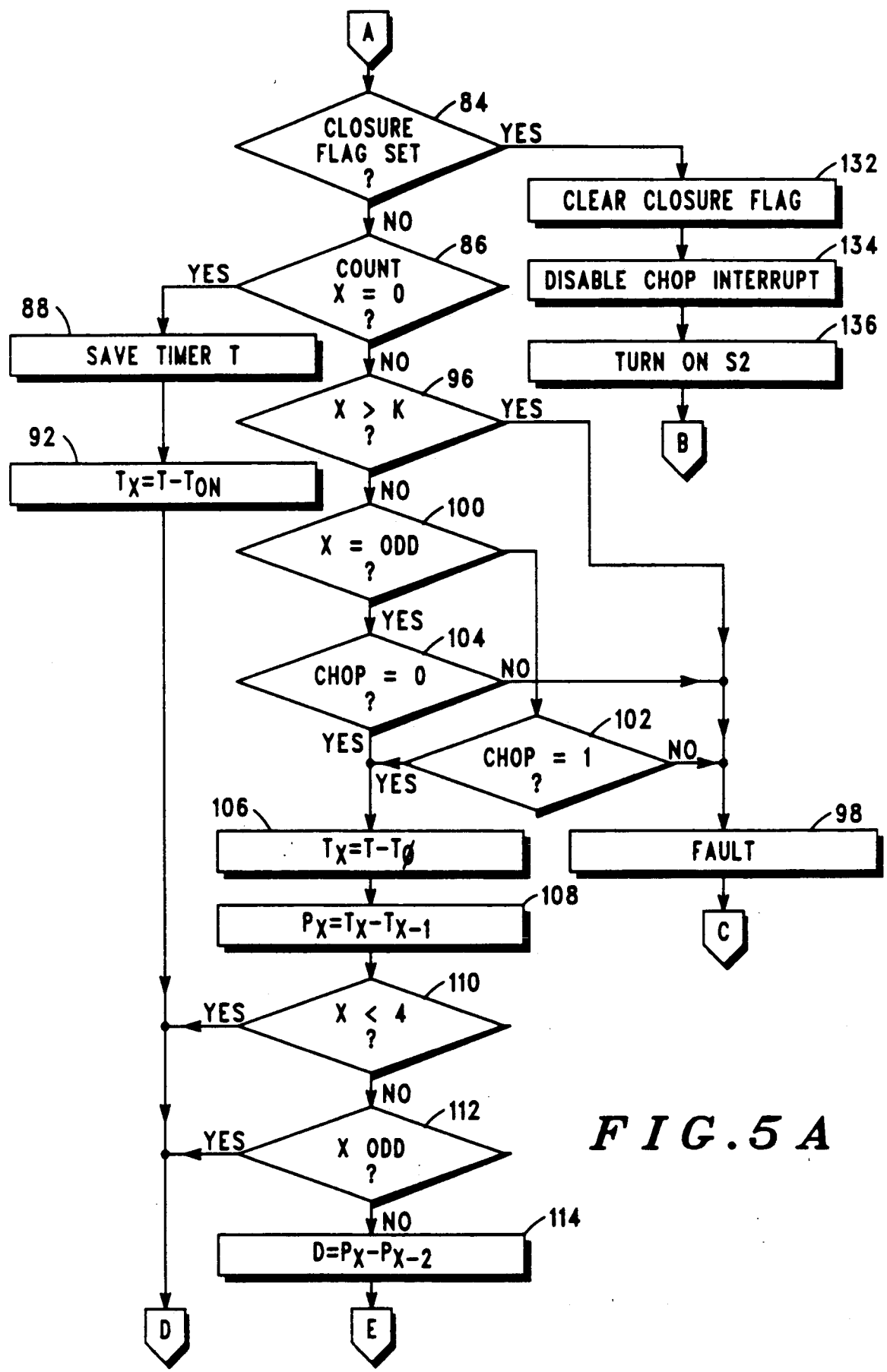
Figure 5B:
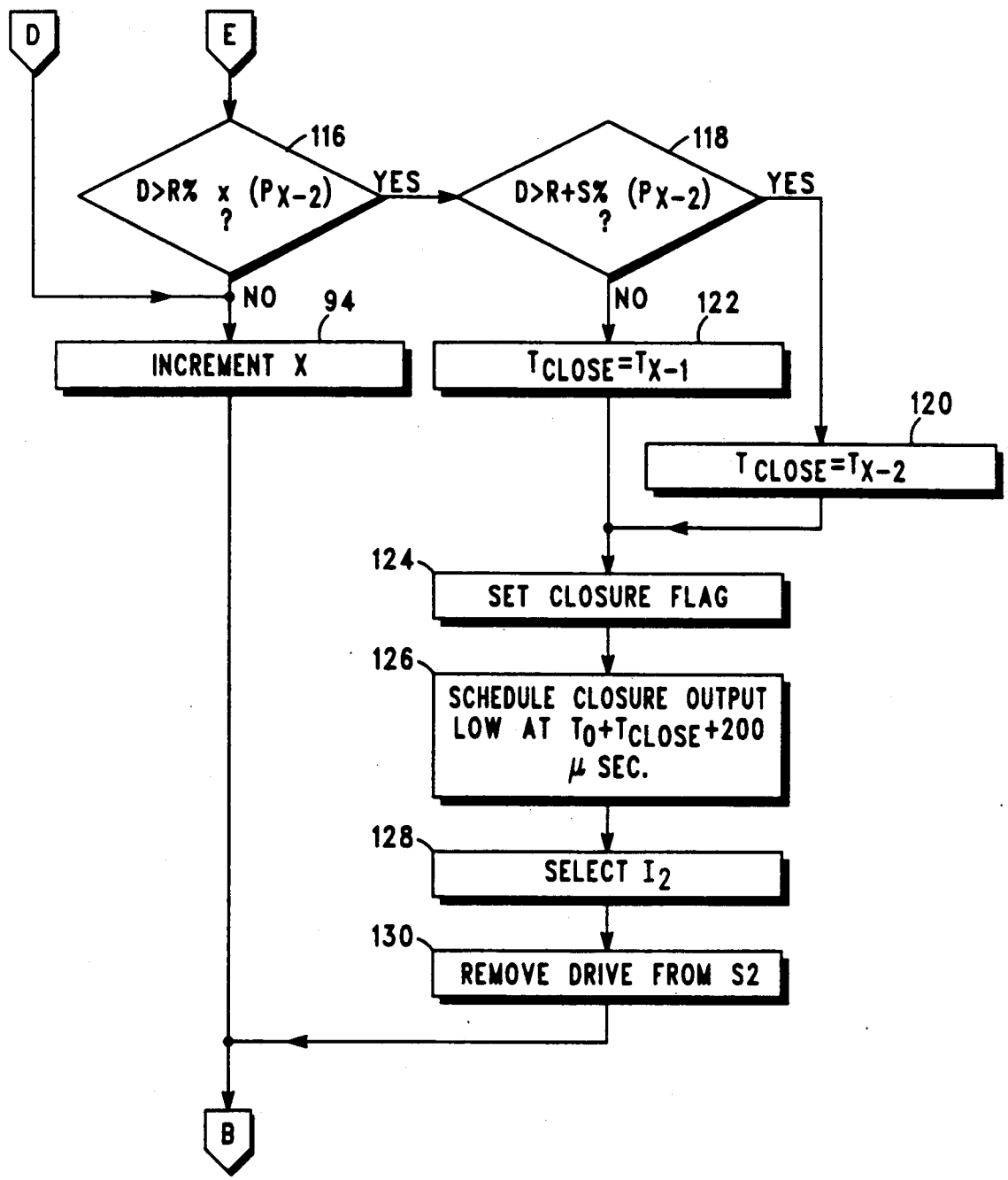

Referring to FIG. 5B again, instruction 128 causes the microprocessor to "select $I_2$", i.e., close SB so that the comparator 22 now receives $I_2$ ref. The next instruction 130 causes the microprocessor to remove the drive from S2 (FIG. 1), thereby placing S2 in an open condition. The resulting increase in voltage at the collector of transistor 15 turns on the zener diode 42, thereby causing the transistor 15 to turn on and rapidly sink current from the coil 12. This action corresponds to the steep current drop shown at 44 in FIG. 2. When the solenoid current reaches the level $I_{2a}$ at time $t_2$, $V_{out}$ goes high, the microprocessor senses another interrupt, and the program shown in FIG. 5A is entered via A. The answer to the question posed by instruction 84 is "yes", because the closure flag was set when instruction 124 was executed. Consequently, the program proceeds to execute instruction 132 to clear the closure flag. Then instruction 134 disables the chop interrupt, thereby prioritizing instruction 62 (FIG. 4) over instruction 60 for the next pass through that part of the program. The switch S2 is then turned on by execution of the next instruction 136. This enables the solenoid current to flow through the coil 12, and this current will alternate between levels $I_2$ and $I_{2a}$ as shown in FIG. 2 until it is desired to terminate the current through the coil and open the solenoid, as shown at time $t_3$ in FIG. 2.

Figure 7:
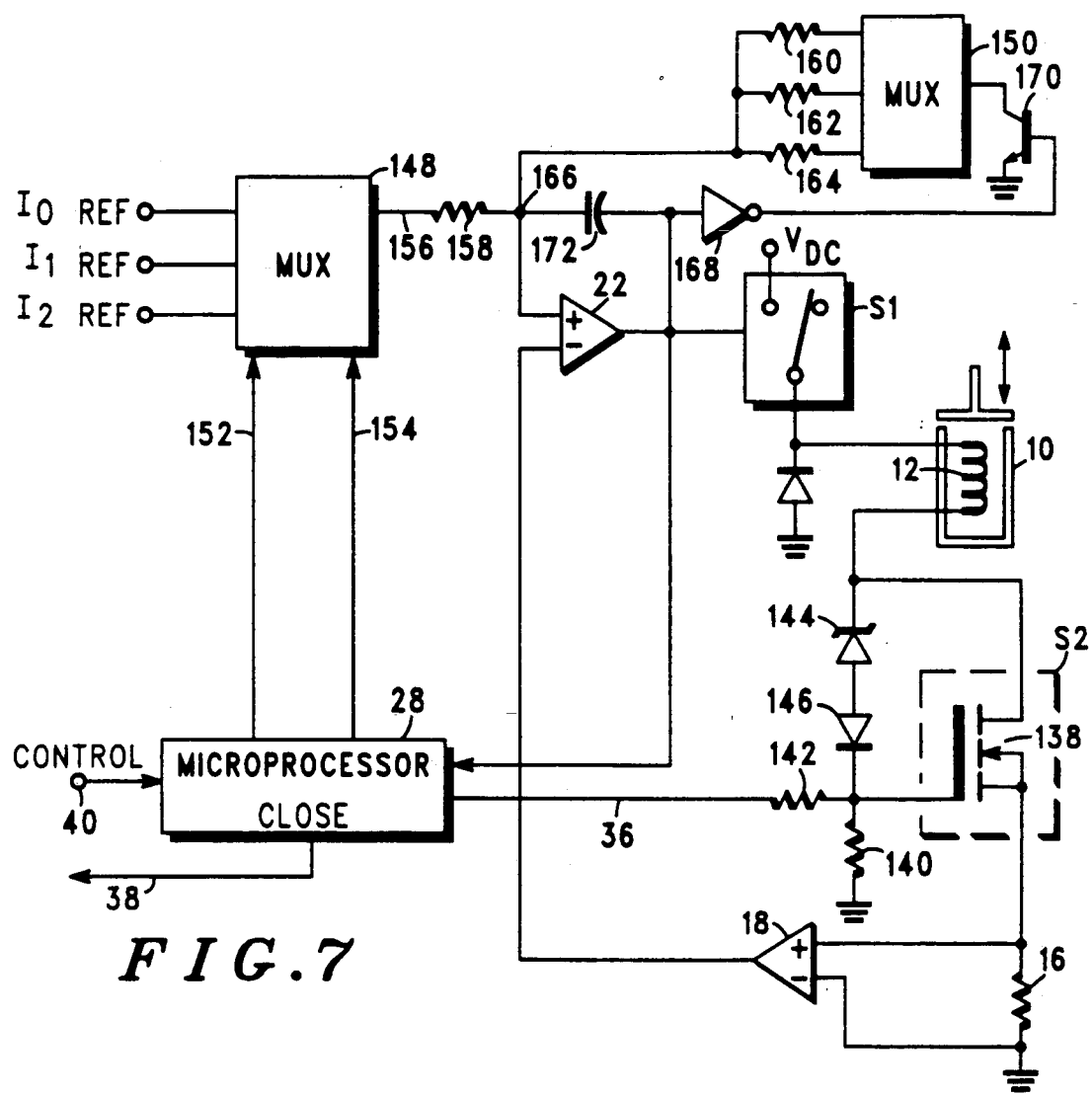
FIG. 7 is a schematic diagram of another embodiment of a solenoid driver according to the invention.
Figure 8:
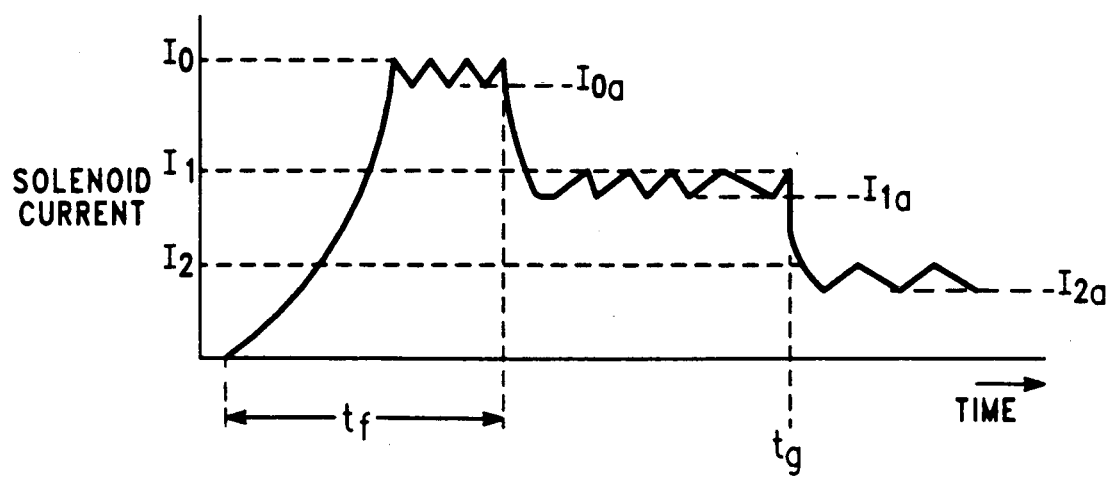
FIG. 8 shows a waveform representing the solenoid current developed by the circuit shown in FIG. 7.

The foregoing discussion was based on the operation of a solenoid that operates essentially at two main levels of currents, $I_1$, and $I_2$, and wherein the closure of the solenoid was sensed while the solenoid current was at or near the current level $I_1$ (see FIG. 2). However, the invention is also useful in sensing closure of a solenoid that operates with current levels that are different than those shown in FIG. 2. FIG. 7, to which reference is now made, shows an illustrative arrangement in which the solenoid 10 operates at three different main current levels, $I_0$, $I_1$, and $I_2$, and wherein solenoid closure is sensed while the middle level of current, $I_1$, is flowing in the solenoid coil 12. FIG. 8 illustrates the different levels of solenoid current that flow in the coil 12.

Other differences in the embodiment of FIG. 7 involve the use of a pair of multiplexers for selecting reference current levels, and a field effect transistor 138 for the switch S2. Similar components in FIGS. 1 and 7 have been given the same reference numerals.

Referring first to the transistor 138, its gate is coupled to a pair of resistors 140 and 142 as shown. A zener diode 144 is coupled in series with another diode 146, and the pair of diodes are coupled between the gate and drain of the transistor 138.

In this embodiment, a first multiplexer 148 supplies signals indicative of the desired level of current in the solenoid coil, and a second multiplexer 150 is used to modify those signals and provide lower current levels, similarly to the effect created by the hysteresis used by the driver shown in FIG. 1. Both multiplexers are conventional, and each may be one-half of a 74HC4052 multiplexer made by Motorola, Inc. Because both multiplexers are in the same physical package, the microprocessor may exercise control over both of them by means of a single pair of binary coded leads 152 and 154.

Referring more specifically to the multiplexer 148, it receives input signals $I_0$ REF, $I_1$ REF and $I_2$ REF which correspond to three difference desired current levels for the coil 12. In response to commands received on the leads 152 and 154, the multiplexer 148 outputs a signal on an output lead 156 corresponding to one of the input reference current levels. That output signal is coupled to one input of the comparator 22 via an impedance in the form of a resistor 158. The multiplexer 150, also responsive to the commands on leads 152 and 154, selects one of three output resistors 160, 162, 164 for the purpose of lowering the value of the signal at the noninverting input of the comparator 22 (node 166) when it is desired for the current in the coil 12 to decay to a level somewhat lower than the reference levels supplied by the multiplexer 148. The identification of the resistor to be selected is made by microprocessor 28, but the timing of the actual selection is controlled by the output of the comparator 22 which is inverted by a gate 168 and applied to the multiplexer 150 by a transistor 170. As will be described more fully below, the comparator 22 develops switching pulses that turn on the switch S1. Each time one of the switching pulses terminates, the multiplexer selects the identified one of the resistors 160, 162, 164 such that the selected resistor is coupled in circuit with the resistor 158. This lowers the level of the signal at node 166, thereby coupling to the comparator 22 a lower reference current level against which to compare the current in the coil.

A capacitor 172 is coupled between the output of the comparator 22 and its non-inverting input. Each time the comparator's output undergoes a transition, the capacitor 172 feeds that transition back to the comparator's input for the purpose of causing the comparator to complete the transition faster and to ensure that the transition moves in the correct direction.

An exemplary cycle of operation for the illustrated embodiment is as follows. The microprocessor 28, which may be programmed as described previously (except for the obvious modifications required to control the multiplexers 148 and 150), closes the switch S2, causes the multiplexer 148 to select $I_0$ REF, and causes the multiplexer 150 to select the resistor 160 (the resistor 160 is now coupled to the collector of the transistor 170). The comparator 22 develops a switching pulse which closes the switch S1. Consequently, solenoid current begins rising toward $I_0$ as shown in FIG. 8.

When the solenoid current is equal to $I_0$, the output of the comparator goes low (i.e., the switching pulse terminates), thus opening the switch S1 and permitting the solenoid current to decay. At the same time, the transistor 170 is turned on, thereby coupling the resistor 160 to ground and lowering the level of the signal at node 166 to a level corresponding to $I_{0a}$. When the solenoid current decays to the level $I_{0a}$, the transistor 170 is turned off so that the level of the signal at node 166 rises to correspond to the level $I_0$.

When that level is reached again by the solenoid current, the comparator 22 terminates its switching pulse and the transistor 170 is again turned on to couple the resistor 160 to ground. The solenoid current again decays toward the level $I_{0a}$. This operation continues, in this embodiment, for a fixed time interval $t_f$ (see FIG. 8) during which the solenoid current repeatedly rises to $I_0$ and then decays to $I_{0a}$.

When the time interval $t_f$ ends, the microprocessor removes gate drive from the transistor 138, causing its drain voltage to rise and turn on the zener diode 144. The transistor 138 dissipates the energy in the coil 12 to cause the solenoid current to decay rapidly. The microprocessor also directs the multiplexer 148 to select $I_1$ REF and directs the multiplexer 150 to select the resistor 162. The value of the resistor 162 is chosen to produce a current level $I_{1a}$ as shown in FIG. 8. Consequently, the solenoid current now varies as described before except that it rises to the level $I_1$, and decays to the level $I_{1a}$. During this operation, the microprocessor is measuring the decay time of the solenoid current in the manner discussed previously. When the time interval between successive current peaks (as measured by the time interval between switching pulses developed by the comparator 22) indicates that the solenoid has closed, the microprocessor again removes gate drive from the transistor 138, wherefore the solenoid current decays rapidly at time $t_g$.

Next, the microprocessor resumes base drive to the transistor 138, causes the multiplexer 148 to select $I_2$ REF, and causes the multiplexer 150 to select the resistor 164. The value of the resistor 164 is chosen to produce a current level $I_{2a}$ as shown in FIG. 8. Consequently, the solenoid current now varies as described before except that it rises to the level $I_1$, and decays to the level $I_{1a}$. During this operation, the microprocessor is measuring the decay time of the solenoid current in the manner discussed previously. When the time interval between successive current peaks (as measured by the time interval between switching pulses developed; by the comparator 22) indicates that the solenoid has closed, the microprocessor again removes gate drive from the transistor 138, wherefore the solenoid current decay rapidly at time $t_g$.

Next, the microprocessor resumes base drive to the transistor 138, causes the multiplexer 148 to select $I_2$ REF, and causes the multiplexer 150 to select the resistor 164. The value of the resistor 164 is chosen to produce a current level $I_{2a}$ as shown in FIG. 8. Consequently, the solenoid current now varies between the levels $I_2$ and $I_{2a}$ until it is desired to open the solenoid.

It can be seen, therefore, that the present invention may be used with a variety of different arrangements for driving a solenoid. In any such arrangement, the closure of the solenoid can be accurately sensed and the solenoid current can then be promptly reduced to lower the amount of power that is dissipated all without delaying the closing of the solenoid.

A particular advantage of the embodiment shown in FIG. 7 is that the solenoid driver may be more accurately calibrated than the embodiment shown in FIG. 1.

Because the characteristics of the comparator 22 vary with changes in temperature, the output level of the comparator can be expected to change with temperature. Since the FIG. 1 embodiment uses hystersis to establish some of the reference current levels, those current levels will be somewhat temperature dependent. In the FIG. 7 embodiment, the reference current levels established by the multiplexer 150 are independent of the characteristics of the comparator 22, thereby making it easier to establish reference current levels that are more predicable and stable.

Although the invention has been described in terms of specific embodiments, it will be obvious to those skilled in the art that various alterations and variations may be made without departing from the invention. Accordingly, it is intended that all such alterations and variations be considered as within the spirit and scope of the invention as defined by the appended claims

We claim:

1. A method for seating a moveable armature of a solenoid that includes a coil, comprising:
   a) establishing current in the coil so as to initiate movement of the armature;
   b) indirectly and repeatedly sensing changes in the inductance of the coil as the armature moves towards a seated position; and,
   c) reducing the current through the coil in response to sensing that the inductance of the coil has changed by a selected amount.

2. A method as set forth in claim 1 wherein the current in the coil is permitted to decay, and step (b) includes measuring the decay time of the current in the coil.

3. A method as set forth in claim 1 wherein step (a) includes establishing a plurality of current peaks in the coil, and wherein step (b) includes measuring the decay time of at least some of the current peaks, and wherein step (c) includes reducing the current through the coil when the decay time of a measured current peak exceeds the decay time of a previously measured current peak by a selected amount.

4. A method for seating a moveable armature of a solenoid that includes a coil, comprising:
   a) applying power to the coil so as to establish a series of current peaks in the coil, each such current peak having a measurable decay time;
   b) sensing the decay times of at least some of the current peaks; and,
   c) reducing the current in the coil when the decay time of a sensed current peak exceeds the decay time of one or more previously sensed current peaks by a selected amount.

5. A method for seating a moveable armature of a solenoid that includes a coil, comprising:
   a) establishing a first series of current peaks in the coil;
   b) measuring the decay time of at least some of the current peaks in the first series;
   c) reducing the current in the coil when the decay time of a measured current peak exceeds the decay time of a previously measured current peak by a selected amount; and
   d) establishing a second series of current peaks in the coil, the amplitude of the current peaks in the second series being smaller than the amplitude of the current peaks in the first series.

6. A method for seating a moveable armature of a solenoid includes a coil, comprising:
   a) establishing a first series of relatively high amplitude current peaks in the coil, and maintaining the current peaks for a fixed time internal,
   b) after the fixed time interval, establishing a second series of relatively lower amplitude current peaks in the coil;
   c) measuring the decay time of at least some of the current peaks in the second series of peaks; and
   d) reducing the current in the coil to a relatively lower level when the decay time of measured current peak exceeds the decay time of a previously measured current peak by a selected amount.

7. A solenoid driver for seating a moveable armature of a solenoid that has a coil, the driver comprising:
   means for establishing current in the coil so as to initiate movement of the armature;
   sensing means for indirectly sensing the inductance of the coil as the armature moves toward a seated position; and,
   means for reducing the current in the coil in response to the sensing means sensing that the inductance of the coil has changed a selected amount.

8. A solenoid driver as set forth in claim 7 wherein said sensing means senses the decay time of the current in the coil.

9. A solenoid driver as set forth in claim 7 wherein the means for establishing current in the coil establishes a plurality of current peaks in the coil, wherein the sensing means senses the decay time of at least some of the current peaks, and wherein the current in the coil is reduced (in response to the decay time of a measured current peak exceeding the decay time of one or more previously measured current peaks by a selected amount.

10. A solenoid driver for seating a moveable armature of a solenoid that has a coil, the driver comprising:
    means for establishing a plurality of current peaks in the coil, each current peak having a decay time;
    means coupled to the coil for sensing the decay times of at least some of the current peaks; and,
    means for reducing the current in the coil when the decay time of a sensed current peak exceeds the decay time of a previously sensed current peak by a selected amount.

11. A solenoid driver for seating a moveable armature of a solenoid that has a coil, the driver comprising:
    switch means for repeatedly coupling the coil to a source of power in response to received switching pulses, thereby to establish currents in the coil and initiate movement of the armature;
    sensing means for sensing the current in the coil;
    means coupled to the sensing means and to the switch means for sending a switching pulse to the switch means in response to current in the coil decaying to a reference value; and,
    logic means receiving the switching pulse for measuring the time intervals between successive switching pulses and for reducing the current in the coil when the duration of a measured time interval exceeds the duration of at least one previously measured time interval by a selected amount.

12. In a solenoid driver having a microprocessor that is programmed to control current through the coil of a solenoid, the improvement comprising:
    a first multiplexer, responsive to control signals from the microprocessor, for outputting, one at a time, a plurality of reference signals indicative of a plurality of difference reference current levels;

sensing means for sensing the level of current in the coil;

a first impedance coupled to the output of the first multiplexer;

a comparator having first and second inputs, the first input receiving the reference signals from the first multiplexer via the first impedance, and the second input being coupled to the sensing means, the comparator developing a switching pulse for energizing the coil, and terminating the switching pulse when the level of current in the coil rises to the reference current level indicated by the received reference signal;

a plurality of second impedances coupled to the first input of the comparator;

a second multiplexer having a first port that is coupled to the second impedances and a second port;

a transistor switch coupled to the second multiplexer's second port, the combination of the transistor switch and the second multiplexer being responsive to the termination of a switching pulse for coupling a selected one of the second impedances in circuit with said first impedance so as to lower the value of the reference signal as received by the comparator, the comparator continuing the termination of the switching pulse until the level of current in the coil decreases to a lower reference value associated with the lowered value of the reference signal.

13. The improvement as set forth in claim 12 wherein the microprocessor is coupled to the comparator and is programmed to measure successive time periods between switching pulses, and to generate a signal when the duration of a measured time period exceeds the duration of a previously measured time period by a selected amount, and further including a switch coupled in series with the coil and responsive to the signal from the microprocessor for switching to an open condition.

* * * * *